United States Patent
Aboushady et al.

(10) Patent No.: US 9,306,594 B2
(45) Date of Patent: Apr. 5, 2016

(54) SIGMA DELTA RF MODULATOR HAVING CAPACITIVE COUPLING, ANALOG/DIGITAL CONVERTER AND APPARATUS INCLUDING SUCH A MODULATOR

(71) Applicants: UNIVERSITE PIERRE ET MARIE CURIE (PARIS 6), Paris (FR); CENTRE NATIONAL DE LA RECHERCHE SCIENTIFIQUE, Paris (FR)

(72) Inventors: Hassan Aboushady, Paris (FR); Nicolas Beilleau, Geneva (CH); Diomadson Belfort, Natal (BR); Ahmed Ashry, Le Caire (EG)

(73) Assignees: UNIVERSITE PIERRE ET MARIE CURIE (PARIS 6), Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/431,689

(22) PCT Filed: Sep. 30, 2013

(86) PCT No.: PCT/EP2013/070379
§ 371 (c)(1),
(2) Date: Mar. 26, 2015

(87) PCT Pub. No.: WO2014/049176
PCT Pub. Date: Apr. 3, 2014

(65) Prior Publication Data
US 2015/0280733 A1    Oct. 1, 2015

(30) Foreign Application Priority Data

Sep. 28, 2012  (FR) .................................. 12 59226

(51) Int. Cl.
*H03M 3/00*    (2006.01)

(52) U.S. Cl.
CPC .............. *H03M 3/408* (2013.01); *H03M 3/354* (2013.01); *H03M 3/438* (2013.01); *H03M 3/458* (2013.01)

(58) Field of Classification Search
CPC ....... H03M 3/43; H03M 3/424; H03M 3/454; H03M 3/496; H03M 3/364; H03M 3/40; H03M 3/41; H03M 3/438; H03M 1/145; H03M 1/146; H03M 1/168; H03M 1/361; H03M 1/46; H03M 1/74; H03M 3/334; H03M 3/34; H03M 3/402; H03M 3/406; H03M 3/434; H03M 3/452; H03M 3/456; H03M 3/476; H03M 3/396; H03M 3/404; H03M 3/45; H03M 3/462; H03M 3/508; H03M 7/3017; H03M 7/3028; H03M 7/3035
USPC .................................................. 341/143, 155
See application file for complete search history.

(56) References Cited

U.S. PATENT DOCUMENTS 5,729,230 A * 3/1998 Jensen et al. ................... 341/143
5,982,315 A   11/1999 Bazarjani et al.
(Continued)

FOREIGN PATENT DOCUMENTS

CN         101917198         12/2010

OTHER PUBLICATIONS

A. Ashry et al., "Using Excess Loop Delay to Simplify LC-Based Sigma-Delta Modulators", Electronics Letters, vol. 45, No. 25, Dec. 2009.
(Continued)

*Primary Examiner* — Jean B Jeanglaude
(74) *Attorney, Agent, or Firm* — Greer, Burns & Crain, Ltd.

(57) ABSTRACT

A continuous-time sigma delta radio frequency modulator is provided, including at least two LC resonators coupled in parallel by a coupling capacitive element, producing an at least $4^{th}$-order bandpass filter, a frequency response of the bandpass filter presenting at least two poles that can be brought closer together or moved further apart depending on the capacitive element value; a feedback loop for shaping the quantization noise with a predetermined noise transfer function; and an adder for receiving: at one of its inputs an analog signal; and at its other input a signal provided by the feedback loop; and the output of which is linked to the input of the bandpass filter, the feedback loop including a finite impulse response filter, the coefficients of which being calculated to obtain a noise transfer function which maximizes the signal-to-noise ratio in a signal bandwidth while ensuring the stability of the feedback loop.

17 Claims, 7 Drawing Sheets

(56) References Cited

U.S. PATENT DOCUMENTS

| | | | |
|---|---|---|---|
| 6,061,008 A * | 5/2000 | Abbey | 341/143 |
| 6,356,603 B1 | 3/2002 | Martin et al. | |
| 6,639,946 B2 | 10/2003 | Wu et al. | |
| 6,693,573 B1 | 2/2004 | Linder | |
| 6,930,624 B2 | 8/2005 | Hezar et al. | |
| 7,057,541 B1 | 6/2006 | Kaplan | |
| 7,136,001 B2 | 11/2006 | Hode et al. | |
| 7,173,980 B2 * | 2/2007 | Masenten et al. | 375/316 |
| 7,545,303 B1 * | 6/2009 | Silva et al. | 341/143 |
| 7,860,189 B2 * | 12/2010 | Petilli et al. | 375/316 |
| 2006/0111074 A1 * | 5/2006 | Petilli et al. | 455/334 |

OTHER PUBLICATIONS

Ahmed Ashry et al., "A Generalized Approach to Design CT Sigma-Delta Modulators Based on FIR DAC", IEEE Internatinoal Symposium on Circuits & Systems, May 2010, pp. 21-24.
A. Ashry et al., "Simple Architecture for Subsampling LC-Based Sigma-Delta Modulators", Electronics Letters, vol. 46, No. 18, Sep. 2, 2010.
Ahmed Ashry et al., "A 3.6GS/s, 15mW, 50dB SNDR, 28MHz Bandwidth RF Sigma-Delta ADC with a FoM of 1pJ/bit in 130nm CMOS", Custom Integrated Circuits Conference, CICC, Sep. 2011, pp. 1-4.
Ahmed Ashry et al., "A 4th Order Subsampled RF Sigma-Delta ADC Centered at 2.4GHz with a Sine-Shaped Feedback DAC", Proceedings of the ESSCIRC (ESSCIRC), Sep. 2011, pp. 263-266.
Nicolas Beilleau et al, "Systematic Design Method for LC Bandpass Sigma-Delta Modulators with Feedback FIRDACs", IEEE International Symposium on Circuits and Systems, May 2006.
Nicolas Beilleau et al., "A 1.3V 26mW 3.2GS/s Unsampled LC Bandpass Sigma-Delta ADV for a SDR ISM-band Receiver in 130nm CMOS", IEEE Radio Frequency Integrated Circujits Symposium, Jun. 2009.
T. Chalvatzis et al., "A Low-Noise 40-GS/s Continuous-Time Bandpass Sigma-Delta ADC Centered at 2 GHz for Direct Sampling Receivers", IEEE Journal of Solid-State Circuits, vol. 42, No. 5, May 2007, pp. 1065-1075.
James A. Cherry et al., "On the Design of a Fourth-Order Continuous-Time LC Delta-Sigma Modulator for UHF A/D Conversion", IEEE Transactions on Circuits and Systems—II: Analog and Digital Signal Processing, vol. 47, No. 6, Jun. 2000, pp. 518-530.
Ivano Galdi et al., "40 MHz IF 1 MHz Bandwidth Two-Path Bandpass Sigma-Delta Modulator with 72 dB DR Consuming 16 mW", IEEE Journal of Solid-State Circuits, vol. 43, No. 7, Jul. 2008, pp. 1648-1656.
Weinan Gao et al., "A 950-MHz IF Second-Order Integrated LC Bandpass Delta-Sigma Modulator", IEEE Journal of Solid-State Circuits, vol. 33, No. 5, May 1998, pp. 723-732.
Subhanshu Gupta et al., "A 0.8-2 GHz Fully-Integrated QPLL-Timed Direct-RF-Sampling Bandpass Sigma-Delta ADC in 0.13 micrometer CMOS", IEEE Journal of Solid-State Circuits, vol. 47, No. 5, May 2012, pp. 1141-1153.
Abla Kammoun et al., "Undersampled LC Bandpass Sigma-Delta Modulators with Feedback FIRDACs", IEEE Internatinal Symposium on Circuits and Systems, Kos, Greece, May 2006.
Todd Kaplan et al., "A 1.3-GHz IF Digitizer Using a 4th-Order Continuous-Time Bandpass Delta-Sigma Modulator", IEEE Custom Integrated Circuits Conference, 2003, pp. 127-130.
Ewout Martens et al., "A 48-dB DR 80-MHz BW 8.88-GS/s Bandpass Delta-Sigma ADC for RF Digitization with Integrated PLL and Polyphase Decimation Filter in 40nm CMOS", IEEE Symposium on VLSI Circuits, 2011, pp. 40-41.
Julien Ryckaert et al., "A 2.4GHz 40mW 40dB SNDR/62dB SFDR 60 MHz Bandwidth Mirrored-Image RF Bandpass Sigma-Delta ADC in 90nm CMOS", IEEE Asian Solid-State Circuits Conference, Nov. 3-5, 2008, pp. 361-364.
Julien Ryckaert et al., "A 2.4 GHz Low-Power Sixth-Order RF Bandpass Sigma-Delta Converter in CMOS", IEEE Journal of Solid-State Circuits, vol. 44, No. 11, Nov. 2009, pp. 2873-2880.
Julien Ryckaert et al., "A 6.1 GS/s 52.8 mW 43 dB DR 80 MHz Bandwidth 2.4 GHz RF Bandpass Delta-Sigma ADC in 40 nm CMOS", IEEE Radio Frequency Integrated Circuits Symposium, 2010.
Bharath Kumar Thandri et al., "A 63 dB SNR, 75-mW Bandpass RF Sigma-Delta ADC at 950 MHz Using 3.8-GHz Clock in 0.25-micrometers SiGe BiCMOS Technology", IEEE Journal of Solid-State Circuits, vol. 42, No. 2, Feb. 2007, pp. 269-279.
N. Beilleau et al., "Using Finite Impulse Response Feedback DACs to Design Sigma-Delta Modulators Based on LC Filters", IEEE Circuits and Systems Symposium, Aug. 7-10, 2005, pp. 696-699.
Jim Kulyk et al., "A Monolithic CMOS 2368+/−30 MHz Transformer Based Q-Enhanced Series-C Coupled Resonator Bandpass Filter", IEEE Journal of Solid-State Circuits, vol. 41, No. 2, Feb. 2006, pp. 362-374.
Vladimir Aparin et al., "Active GaAs MMIC Band-Pass Filters with Automatic Frequency Tuning and Insertion Loss Control", IEEE Journal of Solid-State Circuits, vol. 30, No. 10, Oct. 1995, pp. 1068-1073.
Shaorui Li et al., "An Integrated 1.5 V 6 GHz Q-Enhanced LC CMOS Filter with Automatic Quality Factor Tuning Using Conductance Reference", IEEE Radio Frequency Integrated Circuits Symposium, 2005, pp. 621-624.

* cited by examiner

SIGMA DELTA RF MODULATOR HAVING CAPACITIVE COUPLING, ANALOG/DIGITAL CONVERTER AND APPARATUS INCLUDING SUCH A MODULATOR

BACKGROUND

The invention relates to a continuous-time sigma delta radio frequency modulator. It also relates to an analogue-to-digital radio frequency converter comprising such a modulator as well as an electronic device, such as for example a software-defined radio receiver, comprising such a modulator and/or such a converter.

The field of the invention is the field of processing of radio frequency (RF) signals, and more particularly the field of analogue-to-digital conversion of radio frequency signals, and even more particularly in software-defined radio applications, and in cognitive and opportunistic radio applications.

There is currently an increasing need for RF analogue-to-digital converters having a frequency band, called frequency band of interest, of several tens of megahertz (MHz) centred around a frequency of the order of one gigahertz (GHz). This need is met for example by the development of new radio-communications techniques based on software-defined radio.

Existing RF analogue-to-digital converters are intended to convert the entire band of frequencies received (from DC to several GHz). These converters have the drawback of having a very high power consumption (several watts) and as a result are not suitable for portable electronic devices.

Analogue-to-digital converters of the bandpass Sigma Delta (SD) type constitute a promising response to this need, since the latter are capable of converting a limited frequency band around a certain central frequency. In order to achieve central frequencies of several GHz, the bandpass filter of this type of modulator is most often produced using passive LC resonators. However, the performance of this type of converters is inadequate, in particular in terms of signal-to-noise ratio (SNR).

A method of increasing the SNR, and therefore the performance of a bandpass SD converter, consists of increasing the order of the bandpass LC filter used in the loop of the modulator of an RF SD converter.

The standard solution for producing high-order LC SD modulators is to couple several LC resonators using a Gm transconductor.

FIG. 1 shows an example of such a $4^{th}$-order SD modulator. The modulator 1 comprises a processing chain 2 and a current feedback loop 3, not shown in detail. The feedback loop could also be a voltage feedback loop. Processing chain 2 receives an analogue current X(s) at an input 21 and delivers a digital signal Y(z) at an output 22. Processing chain 2 comprises, connected in series, a first LC resonator 23, a $G_m$ transconductor 24, a second LC resonator 25, and a threshold comparator 26 working at a sampling frequency $f_s$. The first LC resonator 23 is produced by connecting in parallel a capacitor $C_1$ and an inductor $L_1$. A first terminal of this LC resonator 23 is connected to an input terminal 27 of $G_m$ transconductor 24, and a second terminal is connected to a reference voltage $V_{ref}$. Similarly, second LC resonator 25 is produced by connecting in parallel a capacitor $C_2$ and an inductor $L_2$. A first terminal of LC resonator 25 is connected to an output terminal 28 of $G_m$ transconductor 24. A second terminal of LC resonator 25 is connected to the reference voltage $V_{ref}$.

LC resonators 23 and 25 and $G_m$ transconductor 24 form a loop filter for the SD modulator. In the embodiment in FIG. 1, the transfer function of this loop filter can be described by the following equation:

$$H(s) = \frac{G_m \omega_0^2 \omega_1^2 L^2 s^2}{(s^2 + \omega_0^2)(s^2 + \omega_1^2)}$$

This transfer function contains two pairs of complex conjugate poles with the following angular frequencies:

$$\omega_0 = \frac{1}{\sqrt{L_1 C_1}} \text{ and } \omega_1 = \frac{1}{\sqrt{L_2 C_2}}$$

This transfer function contains two zeros in DC, i.e. at zero frequency.

The performance of the SD modulators obtained with architectures based on a coupling with a transconductor is limited. This is due to the large number of active components which increase the noise level and the non-linearity, and therefore degrade the SNR. Moreover, these components increase the power consumption of the modulator.

With the aim of eliminating this coupling transconductor, it was proposed in U.S. Pat. No. 7,057,541 to produce high-order LC filters by connecting several LC resonators in series.

FIG. 2 represents an example of an SD modulator comprising a loop filter formed by two LC resonators in series. Modulator 4 comprises a processing chain 5 and a current feedback loop 3, not shown in detail. Processing chain 5 receives an analogue signal X(s) at an input 51 and delivers a digital signal Y(z) at an output 52. In this modulator 4, processing chain 5 comprises a loop filter 6 formed by a first LC resonator 61 and a second LC resonator 62. Each LC resonator 61, 62 is formed by connecting in parallel a capacitor $C_1$ or $C_2$, and an inductor $L_1$ or $L_2$, respectively. A first terminal of LC resonator 61 is connected to input 51, upstream of threshold comparator 26, a second terminal of LC resonator 61 is connected to a first terminal of LC resonator 62, and a second terminal of LC resonator 62 is connected to a reference voltage $V_{ref}$.

In this embodiment, the transfer function of loop filter 6 of modulator 4 can be described by the following equation:

$$H(s) = \frac{s(L_1 C_2 L_2 s^2 + C_1 L_1 L_2 s^2 + L_2 + L_1)}{(C_1 L_1 s^2 + 1)(C_2 L_2 s^2 + 1)}$$

This transfer function contains, as in the case of the LC resonators coupled by a $G_m$ transconductor, two pairs of complex conjugate poles having the following angular frequencies:

$$\omega_0 = \frac{1}{\sqrt{L_1 C_1}} \text{ and } \omega_1 = \frac{1}{\sqrt{L_2 C_2}}$$

This transfer function contains a zero in DC and a pair of complex conjugate zeros at the following angular frequency:

$$\omega_Z = \sqrt{\frac{L_2 + L_1}{L_1 L_2 (C_1 + C_2)}}$$

This pair of complex conjugate zeros creates anti-resonance at a frequency close to the resonance frequency of the two LC resonators 61, 62. This anti-resonance frequency in the transfer function of feedback filter 6 makes the following design stages very difficult:

stabilizing the feedback loop of the Sigma-Delta modulator;

designing the noise transfer function so as to maximize the signal-to-noise ratio;

designing the signal transfer function so as to avoid changing the bandwidth of interest and to maximize the attenuation outside the bandwidth.

U.S. Pat. No. 7,057,541 does not mention these difficulties and does not offer any technique for overcoming them.

The purpose of the invention is to overcome the aforementioned drawbacks. Thus, it aims to improve performance in terms of noise and non-linearity of standard architectures using LC resonators coupled via transconductors, while still avoiding the introduction of problems of stabilization of the feedback loop and difficulties of design of the noise and signal transfer functions.

Another purpose of the invention is to propose a low-consumption continuous-time sigma delta radio frequency modulator.

Another purpose of the invention is to propose a continuous-time sigma delta radio frequency modulator having a simple design while offering improved performance in terms of signal-to-noise ratio and linearity.

Finally, another purpose of the present invention is to propose a continuous-time sigma delta radio frequency modulator that is easier to tune.

SUMMARY

The invention makes it possible to achieve at least one of the aforementioned purposes via a continuous-time sigma delta radio frequency modulator comprising at least two LC resonators producing a bandpass filter, and coupled to one another by at least one capacitive coupling element, called coupling element.

The resonators coupled to one another make it possible to obtain an at least $4^{th}$-order bandpass filter and therefore to obtain a modulator having a performance similar to the $4^{th}$-order modulators of the state of the art.

The LC resonators are coupled to one another in parallel.

Furthermore, the two LC resonators are coupled to one another capacitively, in contrast to modulators of the state of the art which use transconductors denoted $G_m$ for coupling the LC resonators. In fact, the bandpass filter obtained by capacitive coupling of at least two LC resonators consumes less than the modulators of the state of the art.

Moreover, the design of a bandpass filter obtained by capacitive coupling of two resonators is simpler and less restrictive in terms of linearity. Indeed, a coupling capacitive element that has a simpler design introduces less noise and degrades the linearity of the modulator much less than a transconductor.

According to an advantageous embodiment, the modulator according to the invention comprises exactly two LC resonators producing a bandpass filter coupled to one another in parallel by at least one capacitive element, called coupling capacitive element.

Thus, a $4^{th}$-order bandpass filter is obtained that is easier to design and to tune than higher-order filters while still having adequate performance for current applications, for example software-defined radio, cognitive and opportunistic radio.

According to the invention, the coupling capacitive element can comprise at least one, and in particular exactly one capacitor, called coupling capacitor. A capacitor is a low-cost electronic component commonly used in the field of electronics.

In a preferred embodiment, the at least one coupling capacitor can be a variable capacitor, the value of which can be adjusted, thus adding a degree of additional freedom for adjusting the frequency response of the filter. It is therefore simpler in an LC filter with capacitive coupling to modify the transfer function of the bandpass filter produced by the two resonators and to obtain a noise transfer function (NTF) which maximizes the signal-to-noise ratio in the frequency band of interest. More precisely, the proposed bandpass LC SD architecture makes it possible to easily modify the frequency position of the poles produced by each of the LC resonators of the bandpass filter, in the transfer function of the bandpass filter, in order to place them at the same frequency position as the zeros of the noise transfer function of the modulator, and thus minimize the power of the quantization noise in the desired bandwidth. It is important to note that, despite the fact that the frequency response of the LC filter with capacitive coupling contains significant peaks, the signal transfer function (STF) of the SD modulator is flat in the bandwidth of the signal.

In a preferred version of the modulator according to the invention, at least one LC resonator, preferentially each of the LC resonators, can comprise at least one variable capacitor, the value of which can be adjusted, in order to optimize the position of the zeros in the noise transfer function and as a result minimize the power of the quantization noise in the bandwidth of the bandpass filter.

According to the invention, each LC resonator can comprise at least one capacitive element and at least one inductive element arranged in parallel.

Each capacitive element and/or each inductive element of at least one resonator, or of each of the resonators, can be variable so as to modify, for a given modulator, the frequency band of interest according to the applications and the frequencies concerned for each of the applications.

The modulator according to the invention can also comprise:

a feedback loop, and an adder configured for receiving:
at one of its inputs an analogue signal, and
at its other input a signal provided by said feedback loop and the output of which is linked to the input of the bandpass filter.

The modulator according to the invention can also comprise:

a delay compensation loop of the feedback loop, and
another adder, called second adder, configured for receiving:
at one of its inputs a signal provided by the bandpass filter, and
at its other input a feedback loop delay compensation signal provided by said compensation loop.

Advantageously, at least one of the feedback or compensation loops can comprise a finite impulse response (FIR) filter.

The coefficients of these filters are determined by techniques known in the state of the art.

The modulator according to the invention can moreover comprise at least one means for setting the loop-delay value, at a predetermined value in order to reduce the number of coefficients of the finite impulse response filter(s).

Indeed, it is possible, by adjusting the loop-delay value, to cancel the value of certain coefficients of each of the FIR filters used in the feedback or compensation loop.

Thus, for a 4$^{th}$-order bandpass filter i.e. a filter comprising two LC resonators with capacitive coupling, it is possible to obtain a feedback FIR filter and a compensation FIR filter, each comprising only two non-zero coefficients. As a result, the design of the modulator is simplified and the power consumed is reduced.

In order to identify the appropriate loop-delay value, i.e. the value that must be applied by the means for setting the loop-delay value, it is possible to:
  scan the loop-delay value, for example from 0 to 2 Ts, with Ts corresponding to the sampling period, and
  calculate the corresponding values of each of the coefficients of the FIR filters.

It is possible then to identify an optimum loop-delay value for which one or more coefficients of each of the FIR filters is cancelled.

The device according to the invention can moreover comprise:
  at least one sampling means, and
  at least one quantization means or at least one comparison means;
  a digital-to-analogue converter with a finite impulse response filter called FIRDAC (for Finite Impulse Response Digital-to-Analog Converter) arranged in series between the output of the quantizer and the different feedback nodes and providing an analogue signal.

The sampling means can be arranged to achieve a sampling at a sampling frequency fs such that fs~4*fc with fc being the central frequency of the frequency band of interest.

According to another aspect of the invention a continuous-time analogue-to-digital sigma delta radio frequency converter is proposed comprising at least one modulator according to the invention and at least one digital means of processing the digital signal provided by said modulator in order to provide a digital signal over several bits.

Such digital means can be for example a digital signal processor (DSP).

According to the invention, a modulator or a converter according to the invention is advantageously produced partly or entirely in integrated form within an integrated circuit, more particularly within an electronic chip, for example.

According to another aspect of the invention a wireless communication device is proposed, comprising a modulator and/or a converter according to the invention.

Such a communication device can be presented in the form of an autonomous device or in the form of a module integrated in an assembly.

Such a communication device can for example be a radio frequency wave receiver.

According to a preferred embodiment, a modulator according to the invention and/or a converter according to the invention can be used for producing a receiver for software-defined radio, cognitive and opportunistic radio.

BRIEF DESCRIPTION OF THE DRAWINGS

Other advantages and characteristics will become apparent on examination of the detailed description of an embodiment which is in no way limitative, and the attached diagrams, in which.

DETAILED DESCRIPTION

It is understood that the embodiments which will be described below are in no way limitative. In particular, variants of the invention can be envisaged comprising only a selection of the features described hereinafter in isolation from the other described features, if this selection of features is sufficient to provide a technical advantage or to differentiate the invention from the state of the prior art. This selection comprises at least one preferably functional feature without structural details, or with only a part of the structural details if this part is sufficient on its own to provide a technical advantage or to differentiate the invention from the state of the prior art.

In particular, all the variants and all the described embodiments can be combined with one another if there is nothing which prevents this combination from a technical point of view.

In the Figures, elements common to several figures retain the same references.

Figure 3:
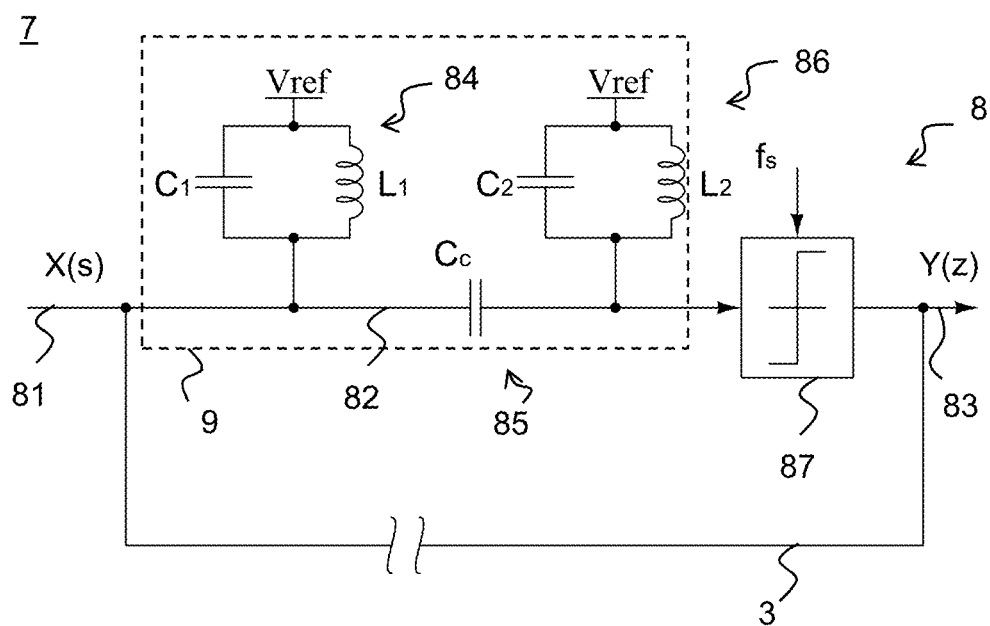
FIG. 3 is a representation of a first example of a bandpass Sigma-Delta modulator according to the invention.

FIG. 3 represents a first example of a bandpass Sigma-Delta modulator according to the invention. Sigma-Delta modulator 7 comprises a processing chain 8 and a feedback loop 3. Processing chain 8 is arranged to receive an analogue signal X(s) at an input 81 of a line 82 processing the signal, and to deliver a digital signal Y(z) at an output 83. The processing chain 8 comprises, connected in series from input 81 to output 83, a first LC resonator 84, a coupling capacitor $C_c$ 85, a second LC resonator 86, and a threshold comparator 87 working at a sampling frequency $f_s$. LC resonators 84, 86 and coupling capacitor $C_c$ 85 form a loop filter 9. First LC resonator 84 comprises a capacitor $C_1$ and an inductor $L_1$ connected in parallel. A first terminal of LC resonator 84 is connected to line 82 and, more precisely, to a first terminal (or electrode) of coupling capacitor $C_c$ 85. A second terminal of LC resonator 84 is connected to a reference voltage $V_{ref}$. Similarly, second LC resonator 86 comprises a capacitor $C_2$ and an inductor $L_2$ connected in parallel. A first terminal of LC resonator 86 is connected to line 82 and, more precisely, to a second terminal (or electrode) of coupling capacitor $C_c$ 85. A second terminal of LC resonator 86 is connected to reference voltage $V_{ref}$. Feedback loop 3 is based on a technique well known to a person skilled in the art and is not detailed here. It can consist of any feedback loop capable of shaping the quantization noise introduced by threshold comparator 87.

The capacitor $C_1$, $C_2$ of each LC resonator 84, 86 can be a variable capacitor.

According to a specific embodiment, each LC resonator 84, 86 is only constituted of a capacitor and an inductor connected in parallel.

The sampling frequency $f_s$ of threshold comparator 87 can be chosen to be less than the Nyquist frequency.

Figure 4:
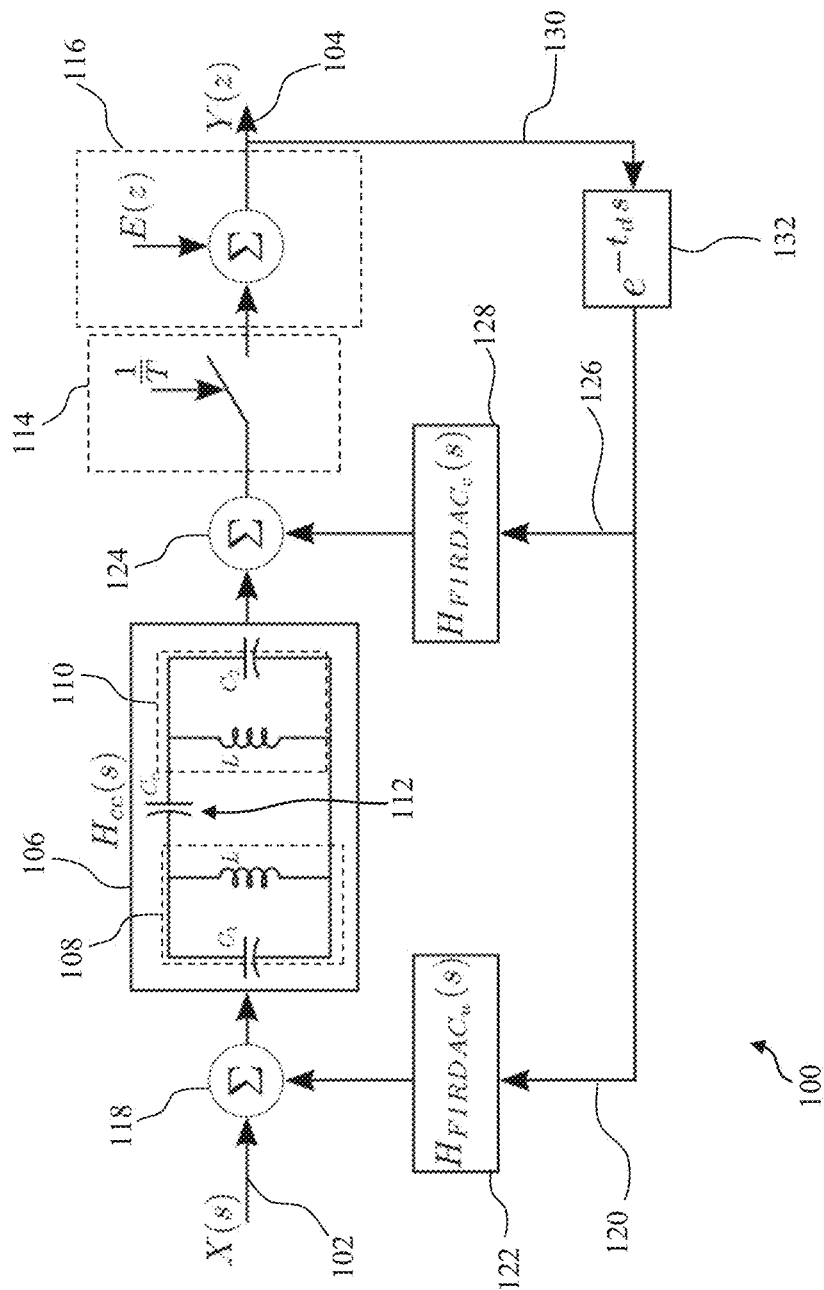
FIG. 4 is a mathematical representation of a second embodiment of a modulator according to the invention containing FIRDACs in a feedback loop.

FIG. 4 is a mathematical representation of a second embodiment of a modulator according to the invention.

The modulator 100 represented in FIG. 4 comprises an input 102 for receiving an analogue signal X(s) and an output 104 providing a digital signal Y(z).

Modulator 100 comprises a bandpass filter 106 produced by two identical LC resonators 108 and 110, coupled to one another by a variable coupling capacitor $C_c$ 112, the value of which can be adjusted. Each LC resonator 108 and 110 is produced by a capacitor, which is also variable, denoted C, and an inductor, denoted L, arranged in parallel.

Modulator 100 also comprises a sampler 114 working at a sampling frequency 1/T, and a quantizer 116. Quantizer 116 introduces into modulator 100 a quantization noise symbolized by the arrow denoted E(z). Sampler 114 and quantizer 116 are arranged in series next to output 104 of modulator 100, positioned such that sampler 114 is located between bandpass filter 106 and quantizer 116.

Modulator 100 comprises a first adder 118 arranged between input 102 of modulator 100 and bandpass filter 106, the first adder 118 comprising two inputs and one output.

Modulator 100 also comprises a feedback loop 120 comprising a digital-to-analogue converter with a finite impulse response (FIR) filter, denoted $FIRDAC_U$, 122. The input of feedback loop 120 is linked to output 104 of modulator 100.

The adder 118 is arranged such that:
one of its inputs is linked to input 102 of modulator 100,
its other input is linked to the output of feedback loop 120, more particularly to the output of the digital-to-analogue converter with a FIR filter 122, and
its output is linked to the input of bandpass filter 106.

Modulator 100 comprises a second adder 124 arranged between bandpass filter 106 and sampler 114, the second adder 124 also comprising two inputs and one output.

Modulator 100 also comprises a delay compensation loop 126 of the feedback loop comprising a digital-to-analogue converter with a FIR filter, denoted $FIRDAC_C$, 128. The input of compensation loop 126 is linked to output 104 of modulator 100.

The second adder 124 is arranged such that:
one of its inputs is linked to the output of bandpass filter 106,
its other input is linked to the output of compensation loop 126, more particularly to the output of the digital-to-analogue converter with a FIR filter 128, and
its output is linked to the input of sampler 114.

Feedback loop 120 and compensation loop 126 comprise a common part 130 at their inputs.

Modulator 100 comprises a means 132 for setting the loop-delay value, arranged on common part 130 and making possible an adjustment of the loop-delay value for each of the feedback and compensation loops.

The functioning of modulator 100 is as follows:
an analogue signal enters modulator 100 by its input 102;
the analogue signal provided by the bandpass filter is sampled at a sampling frequency fs by sampler 114;
each sample of signal is provided to quantizer 116, which provides therefrom a one-bit digital signal.

The role of feedback loop 120 is to shape the quantization noise with a certain noise transfer function (NTF). The NTF is designed so as to minimize the power of the quantization noise in the bandwidth and as a result maximize the signal-to-noise ratio in this band.

The loop delay is due to the response time of the quantizer and the propagation time of FIRDACs 122 and 128. This unwanted delay modifies the NTF and degrades the signal-to-noise ratio (SNR) and can cause feedback loop instability.

The role of compensation loop 126 is to compensate for the effect of the loop delay in order to obtain the required NTF.

Assuming an LC filter with $4^{th}$-order capacitive coupling with LC resonators having ideal quality factors, the transfer function of bandpass filter 106 in FIG. 4 is given by the following relationships:

$$H_{cc}(s) = \frac{s^3 \frac{C_c}{C_1 C_2 + C_1 C_c + C_c C_2}}{s^4 + s^2 \frac{C_1 + C_2 + 2C_c}{(C_1 C_2 + C_1 C_c + C_c C_2)L} + \frac{1}{(C_1 C_2 + C_1 C_c + C_c C_2)L^2}} \quad (1)$$

$$\omega_0 = \sqrt{2} \sqrt{-\frac{1}{\left(C_1 + C_2 + 2C_c - \sqrt{(C_1 - C_2)^2 + 4C_c^2}\right)L}} \quad (2)$$

$$\omega_1 = \sqrt{2} \sqrt{-\frac{1}{\left(C_1 + C_2 + 2C_c + \sqrt{(C_1 - C_2)^2 + 4C_c^2}\right)L}} \quad (3)$$

where s is the Laplace variable, $w_0$ and $w_1$ being the oscillation frequencies of the 2 LC resonators. Equations (1), (2) and (3) show that there are 3 parameters which make it possible to control the position of $w_1$ and $w_2$. These 3 parameters are: $C_1$, $C_2$ the capacitance of the $1^{st}$ and $2^{nd}$ LC resonators respectively, and coupling capacitance $C_C$.

The transfer functions of FIRDAC filters 122 and 128 are given respectively by the following relationships:

$$H_{FIRDAC_U}(s) = H_{DAC}(s) \sum_{i=0}^{M_U-1} \alpha_i e^{-iT} \text{ for FIR filter 122, and} \quad (4)$$

$$H_{FIRDAC_C}(s) = H_{DAC}(s) \sum_{i=0}^{M_C-1} \beta_i e^{-iT} \text{ for FIR filter 128 with} \quad (5)$$

$$H_{DAC}(s) = \frac{1 - e^{-sT}}{s} \quad (6)$$

where $M_U$ and $M_C$ are respectively the order of FIRDAC filters 122 and 128, which in the present case is equal to four.

The loop gain is given by:

$$G_{cc}(z) = Z\{H_{cc}(s)H_{FIRDAC_U}(s) + H_{FIRDAC_C}(s)\} \quad (7)$$

The noise transfer function of modulator 100 is given by:

$$NTF_c(z) = \frac{1}{1 - G_{cc}(z)} \quad (8)$$

The signal transfer function of modulator 100 is given by:

$$STF_c(s) = \frac{H_{cc}(s)}{1 - G_{cc}(e^{sT})} \quad (9)$$

-continued $$STF_c(s) = \frac{H_{cc}(s)}{1 - G_{cc}(e^s)}$$

The coefficients of the FIRDACs are calculated in order to obtain a certain NTF which maximizes the SNR in the bandwidth of the signal while ensuring the stability of the system. An additional delay can be added to the unwanted loop delay in order to cancel certain coefficients of FIRDAC filters 122 and 128. In order to do this, the loop-delay values are scanned and the values of each of the coefficients are calculated for each loop-delay value. An optimum loop-delay value can then be identified, for which the value of one or more coefficients of FIRDAC filters 122 and 128 is zero.

An example is given hereinafter in order to illustrate this optimization of the system.

Figure 5:
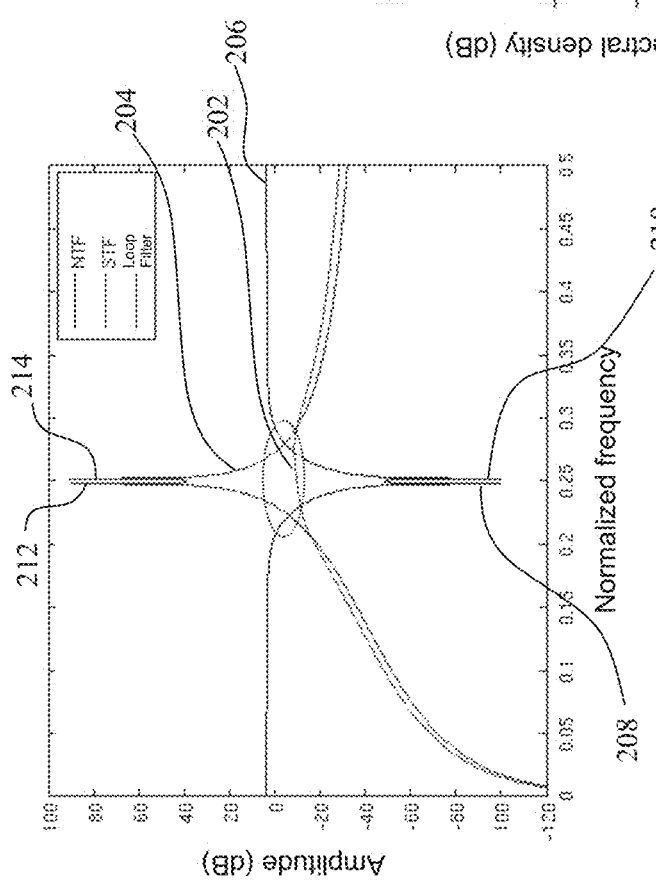
FIG. 5 shows, for the example modulator in FIG. 4, the transfer function of the loop filter, the noise transfer function and the signal transfer function.

FIG. 5 is a diagrammatic representation of the transfer functions of different elements of the modulator in FIG. 4 obtained by simulation.

In FIG. 5, the x-axis represents the normalized frequency of the signal with respect to the sampling frequency, namely fc/fs, with fc being the signal frequency and fs the sampling frequency. The y-axis represents the amplitude in dB.

Curve 202 represents the signal transfer function of modulator 100, curve 204 represents the transfer function of bandpass filter 106 and curve 206 represents the noise transfer function of the modulator.

The frequency band of interest is centred around the normalized frequency 0.25, i.e. the fc/fs ratio is 0.25.

The noise frequency response of the modulator (curve 206) gives two zeros, 208 and 210.

As for the frequency response of the filter (curve 204), this presents two poles 212 and 214. The frequency position of these poles 212 and 214 can be changed by changing the value for the coupling capacitance $C_c$ and the poles 212 and 214 can be brought closer together or moved further apart depending on the value for the coupling capacitance. It is important to note that, despite the fact that the frequency response of the LC with capacitive coupling contains significant peaks due to these poles, the signal transfer function (STF) of the SD modulator is flat (curve 202) in the frequency band of interest centred around 0.25. Moreover, this STF has the response of a bandpass filter having the same order as the modulator. This filter contributes to the attenuation of the out-of-band signals.

Figure 6:
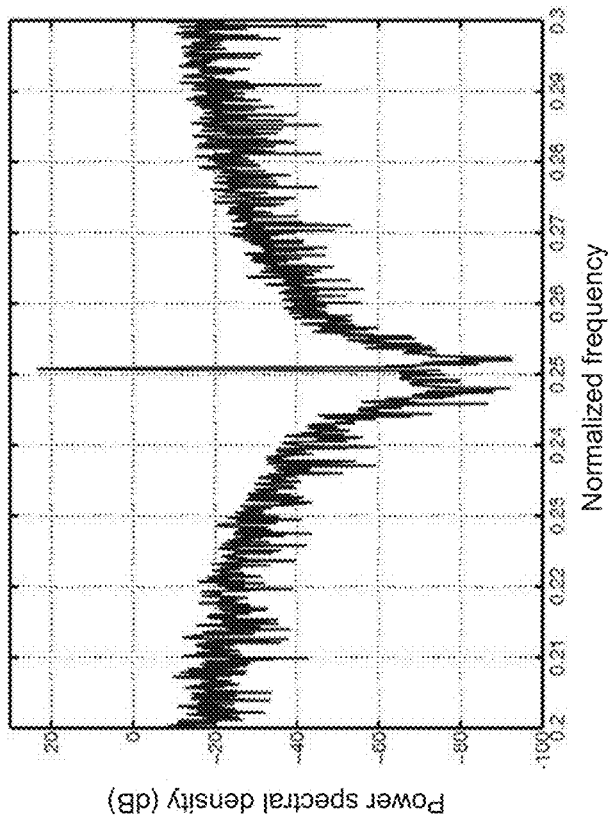
FIG. 6 is a diagrammatic representation of a simulation result obtained for the modulator in FIG. 4 showing the power spectral density.

FIG. 6 is a diagrammatic representation of the power spectral density of the modulator in FIG. 4 obtained by simulation.

In FIG. 6, the x-axis represents the normalized frequency with respect to the sampling frequency, fs. The y-axis represents the power spectral density in dB.

Figure 7:
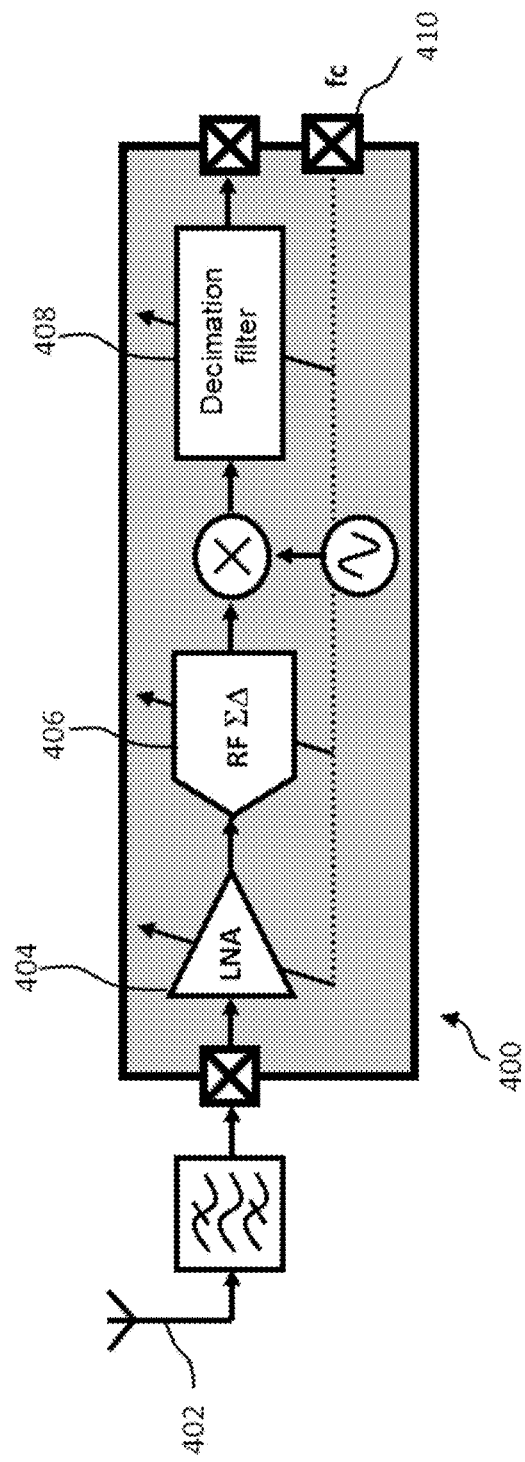
FIG. 7 is a diagrammatic representation of an RF receiver architecture according to the invention.

FIG. 7 is a diagrammatic representation of the architecture of an RF receiver according to the invention.

The receiver 400 represented in FIG. 7 can be a software-defined radio, cognitive and opportunistic radio receiver.

Receiver 400 comprises an antenna 402 for receiving an analogue signal.

The analogue signal is provided to an amplifier 404 amplifying the received signal.

Figure 1:
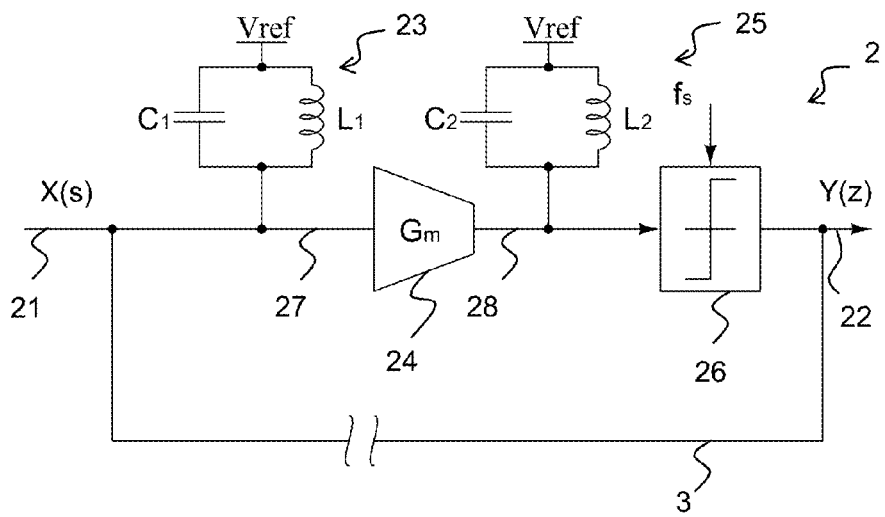
FIG. 1, already described, is a representation of the standard architecture for producing a bandpass Sigma-Delta modulator using LC resonators coupled by a $G_m$ transconductor.
Figure 2:
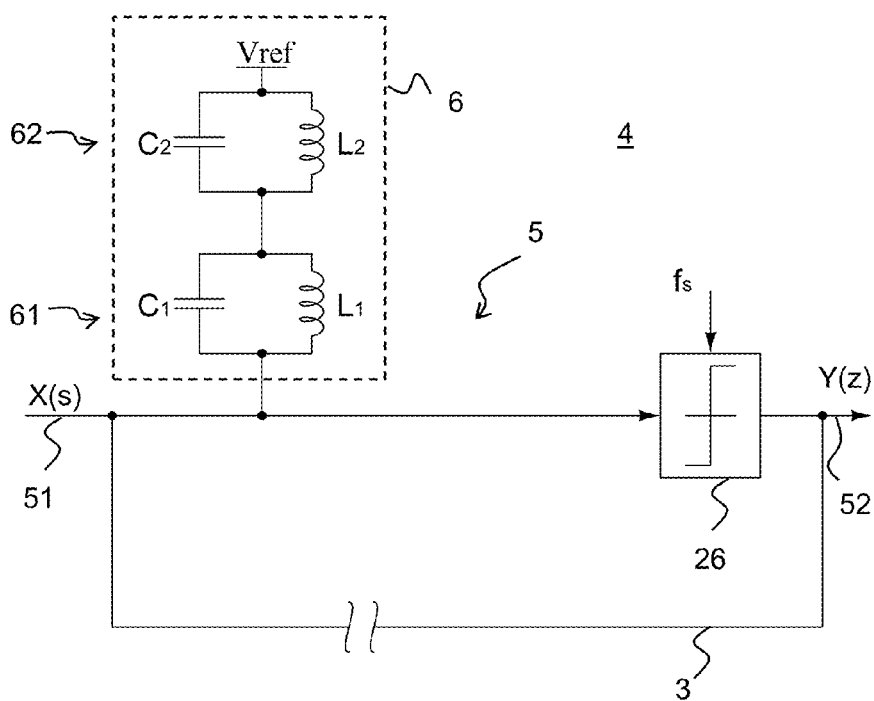
FIG. 2, already described, is a representation of a bandpass Sigma-Delta modulator using LC resonators linked in series.

The amplified analogue signal is provided to an analogue-to-digital SD RF converter 406 comprising a modulator according to the invention, for example modulator 100 in FIG. 1. Converter 406 provides a digitized version of the analogue signal but only for the frequencies comprised in the frequency band of interest, centred around a central frequency denoted fc.

The digital signal provided by converter 406 is then sent via a digital processing stage comprising for example a decimation filter 408.

The receiver also comprises a module 410 for adjusting/modifying the central frequency fc of the frequency band of interest.

By way of example, a $4^{th}$ order modulator with an LC filter with capacitive coupling 100 was produced with CMOS 130 nm technology. The modulator uses the technique of subsampling in order to reduce sampling frequency and as a result the consumption. The modulator is centred around a central frequency, fc=432 MHz, with a clock frequency, fs=4/3 fc=576 MHz, and an oversampling ratio of 64, the values of the coefficients. An SNR of 50 dB was measured in a bandwidth of 4.5 MHz for a power consumption of 20 mW. In this architecture, a loop delay of 1.5 Ts was used so as to reduce the number of coefficients of the feedback FIRDACs. These coefficients are given in the following table:

| Filter | coefficients | Value of the coefficients |
|---|---|---|
| FIRDAC$_U$ 122 | $\alpha_1$ | 1.30 |
|  | $\alpha_2$ | 0.00 |
|  | $\alpha_3$ | 1.00 |
|  | $\alpha_4$ | 0.00 |
| FIRDAC$_C$ 128 | $\beta_1$ | 0.00 |
|  | $\beta_2$ | -0.50 |
|  | $\beta_3$ | 0.00 |
|  | $\beta_4$ | 0.80 |

Thus, for an optimum value of 1.5 Ts, it is noted that for each of filters 122 and 128, two coefficients are zero.

Figure 8:
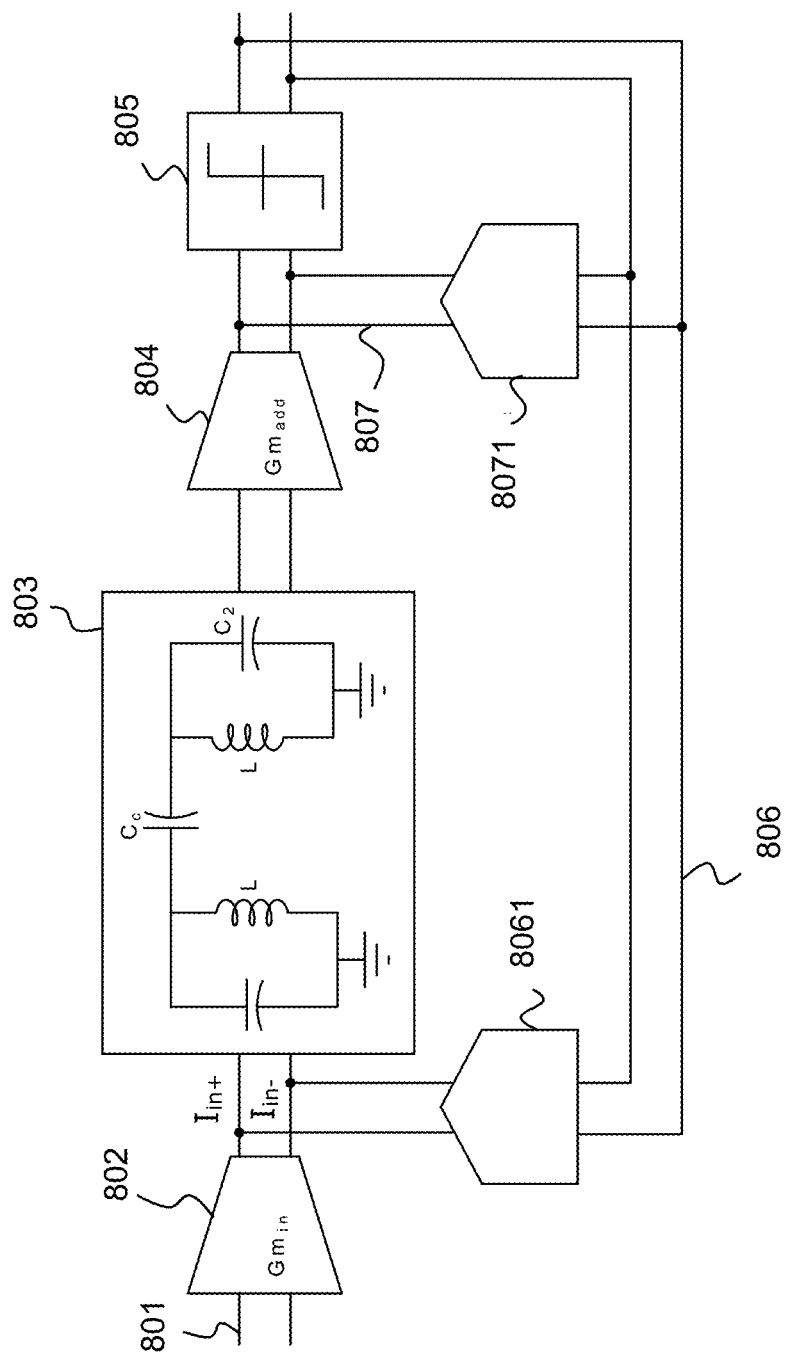
FIG. 8 is a diagrammatic representation of a practical embodiment adapted for on-chip integration of the Sigma-Delta modulator according to the invention.

FIG. 8 represents, diagrammatically, an embodiment of a differential Sigma-Delta modulator according to the invention capable of being integrated into an electronic circuit such as an integrated circuit. The Sigma-Delta modulator 800 comprises, connected in series, an input 801 capable of receiving an analogue voltage signal, a transconductor $Gm_{in}$ 802, a loop filter 803, a transconductor $Gm_{add}$ 804 and a threshold comparator 805. Filter 803 comprises a positive differential current input $I_{in+}$, a negative differential current input $I_{in-}$, a positive differential output $V_{out+}$, and a negative differential output $V_{out-}$. The Sigma-Delta modulator 800 comprises, moreover, a first current feedback loop 806 containing a first digital-to-analogue converter with a finite impulse response filter (FIRDAC) 8061, and a second feedback loop 807 containing a second FIRDAC 8071. Transconductor $Gm_{in}$ 802 transforms the signal received at input 801 into current to be subtracted from the signal originating from first current feedback loop 806. The difference between the $Gm_{in}$ transconductor output signal and the signal originating from feedback loop 806 is applied to loop filter 803. The voltage output from loop filter 803 is converted into current using transconductor $Gm_{add}$ 804. The difference between the transconductor $Gm_{add}$ output signal and the signal originating from second feedback loop 807 is applied to threshold comparator 805 in order to deliver the digital output signal.

Loop filter 803 comprises two LC resonators coupled in parallel by a coupling capacitor $C_c$.

The inductors in the LC resonators can have very low quality factors. In the case where an embodiment on an integrated circuit is intended for the bandpass Sigma-Delta modulator, the quality factor may then be too low, which degrades the signal-to-noise ratio considerably. In this case, an active circuit is needed to enhance the quality factor. The active circuit can for example consist of a negative transconductance circuit as described with reference to FIG. 9.

Figure 9:
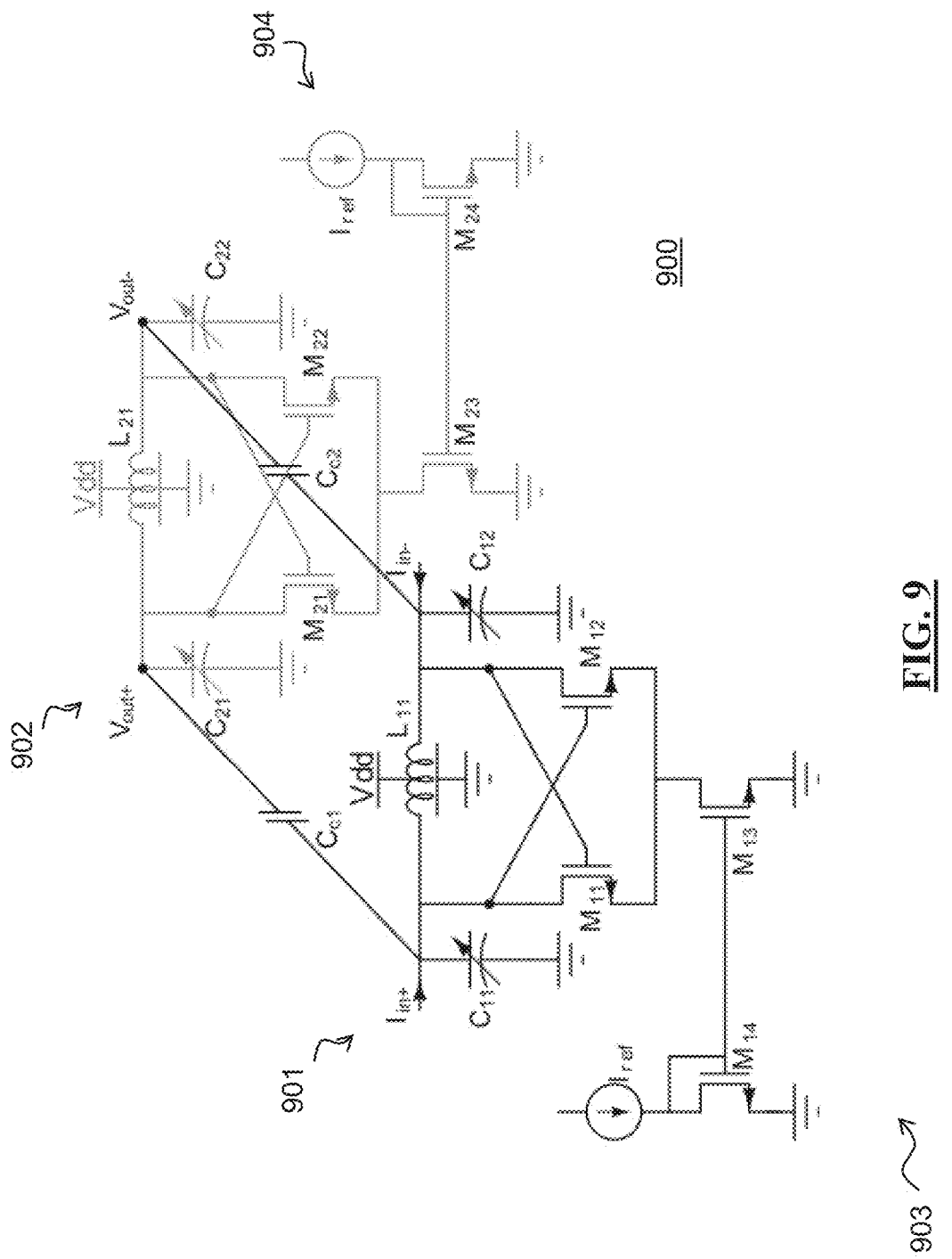
FIG. 9 is a diagrammatic representation of a differential embodiment adapted for on-chip integration of the loop filter of the Sigma-Delta modulator according to the invention.

FIG. 9 represents an example of an integrated $4^{th}$-order LC filter with capacitive coupling. The filter 900 contains two differential LC resonators 901 and 902, and two bias circuits 903 and 904. The first resonator 901 comprises a differential inductor $L_{11}$, two variable capacitors $C_{11}$ and $C_{12}$, and two MOS transistors $M_{11}$ and $M_{12}$. A center tap of the differential inductor $L_{11}$ is linked to a reference potential Vref. A first inductance terminal $L_{11}$ is connected to a first terminal of variable capacitor $C_{11}$ and to the drain of transistor $M_{11}$, and a second inductance terminal $L_{11}$ is connected to a first terminal of variable capacitor $C_{12}$ and to the drain of transistor $M_{12}$. Differential inductance terminals $L_{11}$ form two differential current inputs $I_{in+}$ and $I_{in-}$. The second terminals of variable capacitors $C_{11}$ and $C_{12}$ are grounded. The sources of transistors $M_{11}$ and $M_{12}$ are connected to one another, and biased, as indicated hereinafter. Moreover, the drain of transistor $M_{11}$, respectively $M_{12}$ is connected to the grid of transistor $M_{12}$, respectively $M_{11}$. In this way, transistors $M_{11}$ and $M_{12}$ form a negative transconductance capable of compensating the losses and enhancing the quality factor of resonator 901. Second resonator 902 is identical to resonator 901. Its components are denoted by references incremented by ten. The differential inductance terminals $L_{21}$ form two differential voltage outputs $V_{out+}$ and $V_{out-}$.

Bias circuit 903 makes it possible for the potential applied to the sources of transistors $M_{11}$ and $M_{12}$ to be adjusted. It comprises a current source Iref supplying the drain and the grid of an MOS transistor $M_{14}$, the source of which is grounded. The grid of transistor $M_{14}$ is connected to the grid of an MOS transistor $M_{13}$, the drain of which is connected to the sources of transistors $M_{11}$ and $M_{12}$, and the source of which is grounded. Bias circuit 904 makes it possible for the potential applied to the sources of transistors $M_{21}$ and $M_{22}$ of resonator 902 to be adjusted. It comprises, in the example in FIG. 9, the same components as bias circuit 903. Of course, the bias circuits could be produced differently. It would also be possible to use the same bias current, Iref, for the two resonators.

The two resonators 901 and 902 are coupled to one another in parallel by two coupling capacitors $C_{c1}$ and $C_{c2}$. In particular, first inductance terminal $L_{11}$ is connected to first inductance terminal $L_{21}$ via coupling capacitor $C_{c1}$, and second inductance terminal $L_{11}$ is connected to second inductance terminal $L_{21}$ via coupling capacitor $C_{c2}$.

Filter 900 can in particular be used as a loop filter 803 in the Sigma-Delta modulator in FIG. 8, by connecting the inputs $I_{in+}$ and $I_{in-}$, and the corresponding outputs $V_{out+}$ and $V_{out-}$.

Of course, the invention is not limited to the examples which have just been described.

The invention claimed is:

1. A continuous-time sigma delta radio frequency modulator comprising: at least two LC resonators coupled to one another in parallel by at least one coupling capacitive element, producing an at least 4th-order bandpass filter, a frequency response of the bandpass filter presenting at least two poles that can be brought closer together or moved further apart depending on the value of the coupling capacitive element;
a feedback loop whose role is to shape the quantization noise with a predetermined noise transfer function; and
an adder configured for receiving:
at one of its inputs an analogue signal; and
at its other input a signal provided by said feedback loop;
and the output of which is linked to the input of the bandpass filter, the feedback loop comprising a finite impulse response filter, the coefficients of which being calculated so as to obtain a noise transfer function which maximizes the signal-to-noise ratio in a bandwidth of the signal while ensuring the stability of the feedback loop.

2. The modulator according to claim 1, wherein the modulator comprises exactly two LC resonators producing a bandpass filter, coupled to one another in parallel by at least one capacitive element, called coupling element.

3. The modulator according to claim 1, wherein the capacitive coupling element comprises at least one coupling capacitor.

4. The modulator according to claim 3, wherein the at least one coupling capacitor is a variable capacitor, the value of which can be adjusted.

5. The modulator according to claim 1, wherein at least one LC resonator comprises at least one variable capacitor, the value of which can be adjusted.

6. The modulator according to claim 1, wherein each resonator comprises a capacitive element and an inductive element arranged in parallel.

7. The modulator according to claim 1, wherein the modulator also comprises:
a delay compensation loop of the feedback loop; and
a second adder, configured for receiving:
at one of its inputs, a signal provided by the bandpass filter; and
at its other input a feedback loop delay compensation signal provided by said compensation loop.

8. The modulator according to claim 7, wherein the compensation loop comprises a finite impulse response filter.

9. The modulator according to claim 8, wherein it comprises at least one means for setting the loop-delay value at a predetermined value in order to reduce the number of coefficients of the finite impulse response filter(s).

10. The modulator according to claim 1, wherein the modulator also comprises:
at least one sampling means; and
at least one quantization means;
arranged in series between the output of the bandpass filter and the input of the feedback loop and providing a digital signal.

11. A continuous-time sigma delta radio frequency analogue-to-digital converter comprising: at least one modulator according to claim 1 and at least one digital means of processing the digital signal provided by said modulator in order to provide a multi-bit digital signal.

12. A modulator according to claim 1, wherein the modulator is produced partly or entirely in integrated form within an integrated circuit.

13. A wireless communication device, comprising a modulator according to claim 1.

14. Use of a modulator according to claim 1 for producing a software-defined radio receiver.

15. A converter according to claim 11, wherein the converter is produced partly or entirely in integrated form within an integrated circuit.

16. A wireless communication device, comprising a converter according to claim 11.

17. Use of a converter according to claim 11 for producing a software-defined radio receiver.

* * * * *